US009787435B2

(12) United States Patent
Yasukawa et al.

(10) Patent No.: US 9,787,435 B2
(45) Date of Patent: Oct. 10, 2017

(54) BASE STATION, TERMINAL DEVICE AND RADIO COMMUNICATION SYSTEM

(71) Applicant: NTT DOCOMO, INC., Tokyo (JP)

(72) Inventors: Shimpei Yasukawa, Tokyo (JP); Qin Mu, Beijing (CN); Liu Liu, Beijing (CN); Lan Chen, Beijing (CN)

(73) Assignee: NTT DOCOMO, INC., Tokyo (JP)

( * ) Notice: Subject to any disclaimer, the term of this patent is extended or adjusted under 35 U.S.C. 154(b) by 0 days.

(21) Appl. No.: 14/906,309

(22) PCT Filed: Jun. 20, 2014

(86) PCT No.: PCT/JP2014/066383
§ 371 (c)(1),
(2) Date: Jan. 20, 2016

(87) PCT Pub. No.: WO2015/012032
PCT Pub. Date: Jan. 29, 2015

(65) Prior Publication Data
US 2016/0173231 A1 Jun. 16, 2016

(30) Foreign Application Priority Data
Jul. 22, 2013 (JP) .................................. 2013-151897

(51) Int. Cl.
*H04W 24/00* (2009.01)
*H04L 1/00* (2006.01)
(Continued)

(52) U.S. Cl.
CPC .......... *H04L 1/0061* (2013.01); *H04L 1/0072* (2013.01); *H04L 1/08* (2013.01);
(Continued)

(58) Field of Classification Search
CPC ....... H04L 1/0061; H04L 1/0072; H04L 1/08; H04L 1/0046; H03M 13/09; H04W 72/042
See application file for complete search history.

(56) References Cited

U.S. PATENT DOCUMENTS

2010/0215011 A1* 8/2010 Pan ...................... H04L 5/0064
370/329
2011/0283171 A1* 11/2011 Siew ..................... H04L 1/0079
714/807
(Continued)

FOREIGN PATENT DOCUMENTS

WO 2012/110830 A1 8/2012
WO 2013/074722 A1 5/2013

OTHER PUBLICATIONS

Extended European Search Report in counterpart European Application No. 14 82 8883.0 dated Jun. 15, 2016 (11 pages).
(Continued)

*Primary Examiner* — Barry Taylor
(74) *Attorney, Agent, or Firm* — Osha Liang LLP

(57) ABSTRACT

A base station is configured to transmit control information to a terminal device in a radio communication system, wherein an error detection code that is masked by predetermined identification information is attached to the control information, the base station including a generator configured to generate, upon detecting that a length of first information that is to be masked by the predetermined identification information to generate the error detection code does not correspond to a length of the predetermined identification information, second information that corresponds to the length of the predetermined identification information; and an error detection code generator configured to generate, upon detecting that the second information
(Continued)

is generated, the error detection code in which the second information is masked by the predetermined identification information.

10 Claims, 13 Drawing Sheets

(51) Int. Cl.
  *H04L 1/08* (2006.01)
  *H03M 13/09* (2006.01)
  *H04W 72/04* (2009.01)
(52) U.S. Cl.
  CPC ........... *H03M 13/09* (2013.01); *H04L 1/0046* (2013.01); *H04W 72/042* (2013.01)

(56) References Cited

U.S. PATENT DOCUMENTS

| | | | | |
|---|---|---|---|---|
| 2013/0028219 | A1* | 1/2013 | Lee | H04W 74/006 370/329 |
| 2013/0230017 | A1* | 9/2013 | Papasakellariou | H04W 72/0406 370/330 |
| 2014/0044072 | A1* | 2/2014 | Piggin | H04W 72/005 370/329 |
| 2014/0307696 | A1* | 10/2014 | Choi | H04L 1/0038 370/329 |

OTHER PUBLICATIONS

International Search Report issued in application No. PCT/JP2014/066383 dated Sep. 9, 2014 (4 pages).
Written Opinion issued in application No. PCT/JP2014/066383 dated Sep. 9, 2014 (3 pages).
3GPP TS 36.213 V11.3.0, 10.1.4 HARQ-ACK Repetition; "3rd Generation Partnership Project; Technical Specification Group Radio Access Network; Evolved Universal Terrestrial Radio Access (E-UTRA); Physical layer procedures (Release 11)"; Jun. 2013 (176 pages).
3GPP TS 36.211 V11.3.0, 5.7 Physical random access channel; "3rd Generation Partnership Project; Technical Specification Group Radio Access Network; Evolved Universal Terrestrial Radio Access (E-UTRA); Physical Channels and Modulation (Release 11)"; Jun. 2013 (108 pages).
3GPP TS 36.212 V11.3.0, 5.3.3 Downlink control information; "3rd Generation Partnership Project; Technical Specification Group Radio Access Network; Evolved Universal Terrestrial Radio Access (E-UTRA); Multiplexing and channel coding (Release 11)"; Jun. 2013 (84 pages).
NTT DOCOMO; "RNTI Handling in (E)PDCCH Coverage Enhancement"; 3GPP TSG RAN WG1 Meeting #74, R1-133453, Barcelona, Spain, Aug. 19-23, 2013 (7 pages).
NTT DOCOMO; "RNTI Handling in (E)PDCCH Coverage Enhancement"; 3GPP TSG RAN WG1 Meeting #74bis, R1-134494, Guangzhou, China, Oct. 7-11, 2013 (7 pages).

* cited by examiner

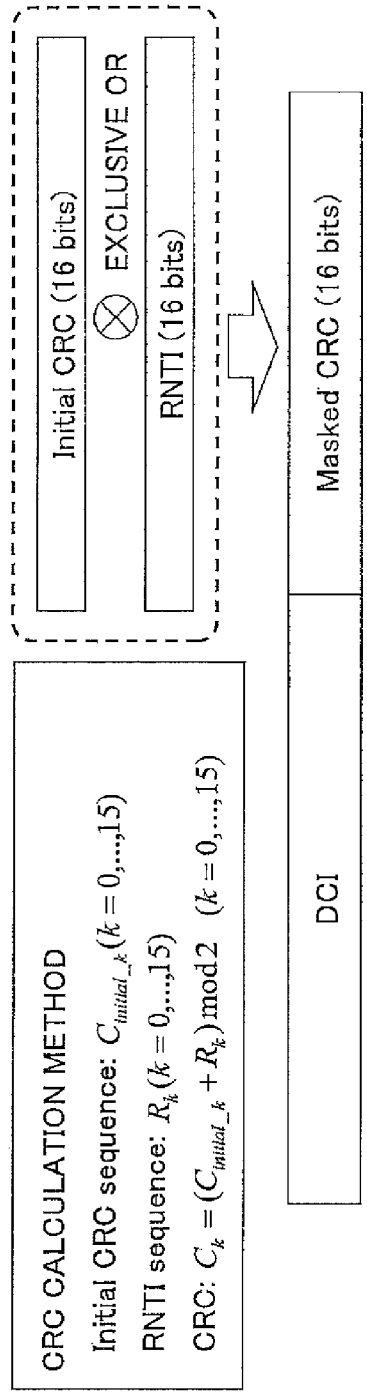
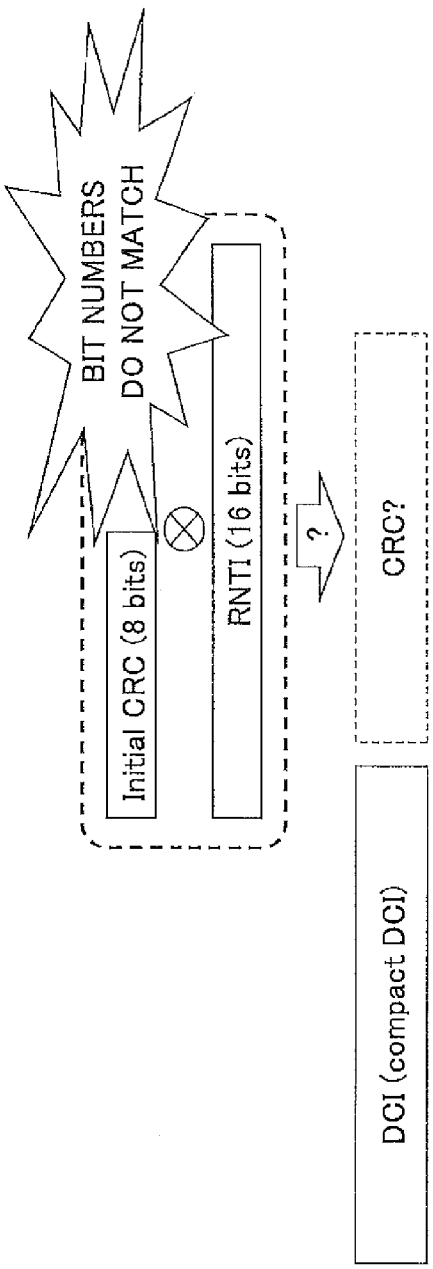
FIG.3A
FIG.3B

BASE STATION, TERMINAL DEVICE AND RADIO COMMUNICATION SYSTEM

TECHNICAL FIELD

The present invention relates to a base station, a terminal device, and a radio communication system.

BACKGROUND ART

Development of Machine-to-Machine Communication has been progressed that is for achieving autonomous communication between terminals without intervention of human operation. The machine-to-machine communication in the Third Generation Partnership Project (3GPP) has been referred to as Machine Type Communication (MTC). In the 3GPP Rel. 11, a network optimization function for an MTC terminal is studied. In the 3GPP Rel. 12, enhancement of coverage against building entrance loss is studied.

The enhancement of coverage may be required for a Shared channel (SCH), a Physical Broadcast Channel (PBCH), a Physical Random Access Channel (PRACH), a Physical Downlink Control Channel (PDCCH)/an Enhanced PDCCH (EPDCCH), a Physical Downlink Shared Channel (PDSCH), a Physical Uplink Shared Channel (PUSCH), a Physical Uplink Control Channel (PUCCH), and so forth.

There are various types of MTC terminals including an MTC terminal that can periodically transmit data, such as a gas meter, an electricity meter, and a temperature/humidity sensor; and an MTC terminal that can transmit data in response to occurrence of a specific event. It can be particularly important to enhance coverage, so that each terminal can quickly establish a radio link, regardless of a type of the MTC terminal and a location and/or an environment in which the MTC terminal is located.

In order to enhance coverage, same information can be repeatedly transmitted in a time domain. For example, for a PUCCH, an Automatic Repeat Request (ARQ) has been adopted that is for repeatedly transmitting the same data frame up to a predetermined number of times, after transmitting a data frame from a transmitting side and upon determining that no "ACK" can be received after a predetermined time has elapsed; and a Hybrid ARQ has been adopted that is combined with an error correction method (cf. Non-Patent Document 1, for example). Additionally, it has been proposed to transmit, through a PRACH, a preamble format for a long sequence (cf. Non-Patent Document 2, for example). It has also been known to apply the Hybrid ARQ to a part of a random access procedure.

Further, for enhancing coverage of a PDCCH, same information may be required to be repeatedly transmitted over a plurality of subframes.

Accordingly, a technique of compact DCI has been disclosed (cf. Patent Document 1, for example) such that a bit length of Downlink Control Information (DCI) that can be transmitted through a PDCCH is shortened. FIG. 1 is a conceptual diagram illustrating a concept of the compact DCI. As shown in FIG. 1, the compact DCI can have a structure such that a shortened CRC is attached to the compact DCI, so that the bit length of the DCI and the bit length of a Cyclic Redundancy Check (CRC), which is one of error detection codes to be attached to the DCI, can be shortened. In this manner, the coverage can be enhanced by repeatedly transmitting the DCI because the bit length of the compact DCI can be less than that of a usual one (normal DCI).

Patent Document 1: WO 2013/074722
Non-Patent Document 1: 3GPP TS36.213, 10.1.4 HARQ-ACK Repetition
Non-Patent Document 2: 3GPP TS36.211, 5.7 Physical random access channel
Non-Patent Document 3: 3GPP TS 36.212, 5.3.3 Downlink control information

SUMMARY OF THE INVENTION

Technical Problem to be Solved

It is desirable to enhance coverage of a physical downlink control channel of a terminal device for receiving control information by allowing a base station to generate an error detection code in which predetermined identification information is masked, regardless of a type of information that is used for generating the error detection code that is to be attached to the control information.

Means for Solving the Problem

According to an aspect of the present invention, there is provided a base station configured to transmit control information to a terminal device in a radio communication system, wherein an error detection code that is masked by predetermined identification information is attached to the control information, the base station including a generator configured to generate, upon detecting that a length of first information that is to be masked by the predetermined identification information to generate the error detection code does not correspond to a length of the predetermined identification information, second information that corresponds to the length of the predetermined identification information; and an error detection code generator configured to generate, upon detecting that the second information is generated, the error detection code in which the second information is masked by the predetermined identification information.

According to another aspect of the present invention, there is provided a terminal device configured to communicate with a base station in a radio communication system, the terminal device including a receiver configured to receive, from the base station, control information to which an error detection code is attached; and an error detector configured to execute, prior to receiving the control information, and upon detecting that a type is reported from the base station, the type indicating whether a length of first information that is to be masked by predetermined identification information so as to generate, by the base station, the error detection code is less than a length of the predetermined identification information, error detection based on the type by using the error detection code that is attached to the received control information.

According to another aspect of the present invention, there is provided a radio communication system including a terminal device; and a base station configured to transmit, to the terminal device, control information to which an error detection code that is masked by predetermined identification information is attached, wherein the base station includes a generator configured to generate, upon detecting that a length of first information that is to be masked by the predetermined identification information to generate the error detection code does not correspond to a length of the predetermined identification information, second information that corresponds to the length of the predetermined identification information; and an error detection code generator configured to generate, upon detecting that the second information is generated, the error detection code in which the second information is masked by the predetermined identification information, and wherein the terminal device includes an error detector configured to execute error detection based on a type that indicates whether the length of the first information is less than the length of the predetermined identification information.

Advantageous Effect of the Invention

According to an embodiment of the present invention, a base station can generate an error detection code that is masked by predetermined information, regardless of a type of information that is used to generate the error detection code that is to be attached to control information, and thereby coverage of a physical downlink control channel of a terminal device that can receive the control information can be enhanced.

BRIEF DESCRIPTION OF THE DRAWINGS

FIGS. 3A and 3B are diagrams illustrating a method of calculating a CRC for normal DCI and for the compact DCI;

EMBODIMENTS TO CARRY OUT THE INVENTION

Figure 1:
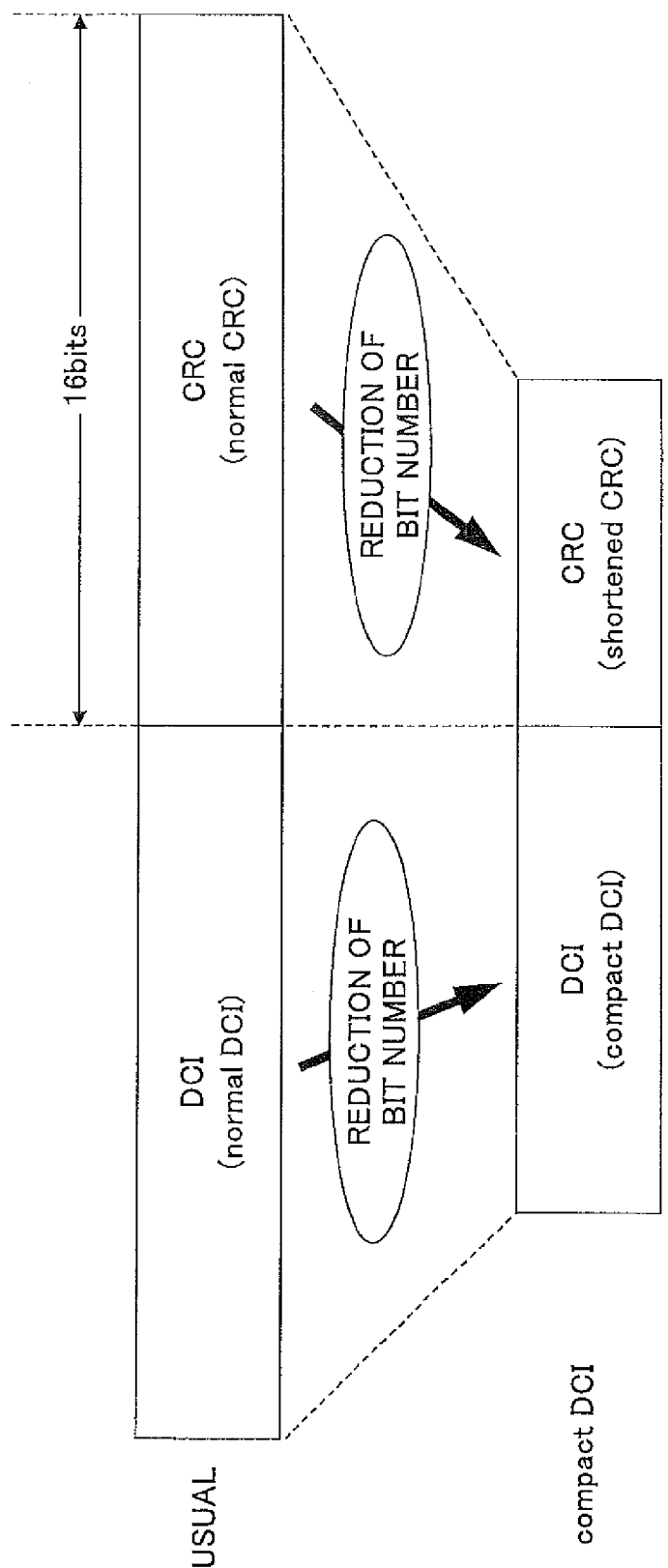
FIG. 1 is a conceptual diagram illustrating an outline of compact DCI.
Figure 2:
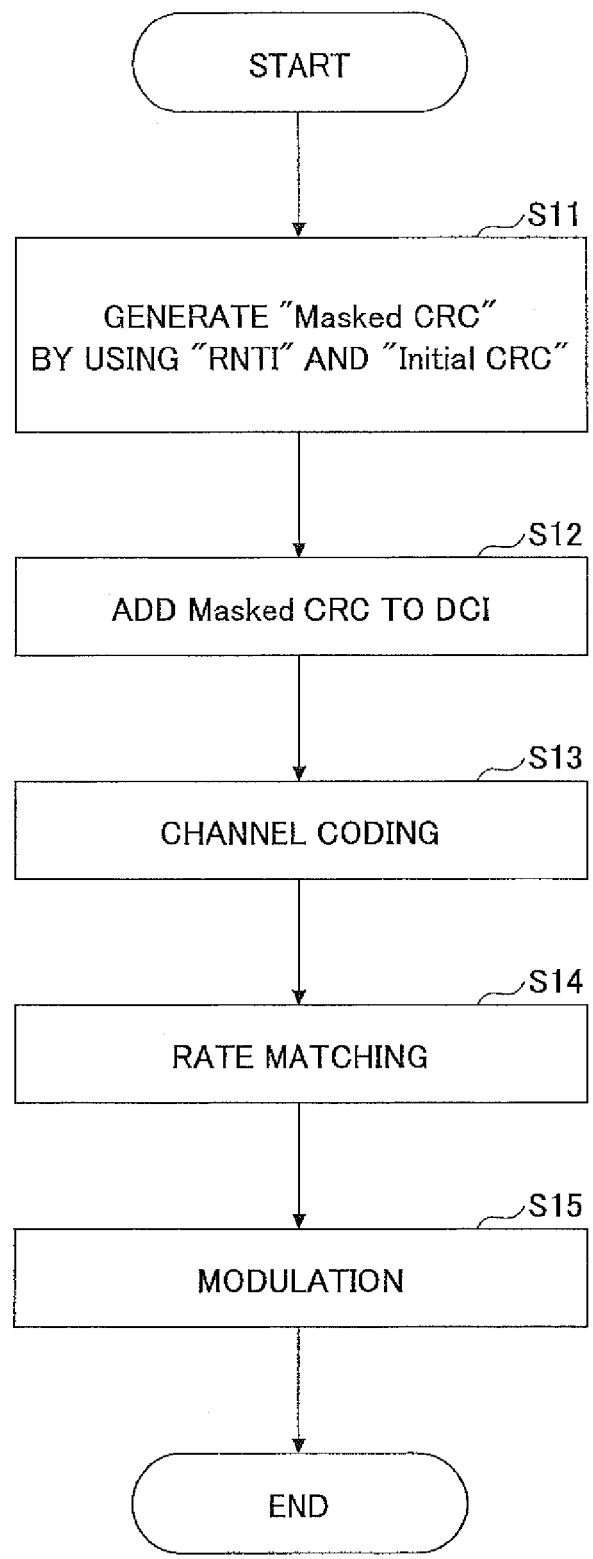
FIG. 2 is a flowchart showing a procedure of coding normal DCI.

A procedure of coding normal DCI by a base station is described by referring to FIG. 2. Note that a procedure of coding DCI is also disclosed in Non-Patent Document 3, for example.

As shown in FIG. 2, first, a base station generates an Initial CRC from DCI by using a predetermined generating polynomial. Then, the generated Initial CRC is masked by using a Radio Network Temporary Identifier (RNTI) that is an identifier to generate a Masked CRC (S11). Note that masking is a process of applying a modulo (mod) 2 operation and/or an exclusive-OR (XOR) operation (which is also referred to as scrambling) to the Initial CRC and the RNTI. Further, the RNTI that is to be masked can be a Cell-RNTI (C-RNTI) (which is also referred to as UE-ID) that is a unique identifier of a terminal device, a Paging-RNTI (P-RNTI) that is for paging, a System Information-RNTI (SI-RNTI) that is for system information, and a Random Access-RNTI (RA-RNTI) for indicating a random access response that is a response to random access preamble transmission by a terminal device. Then, the generated Masked CRC is attached to the DCI (S12). After executing a channel coding process to the DCI to which the Masked CRC is attached (S13), data that is obtained by applying a Rate Matching process (S14) for adjusting a data size by repetition and/or reduction of data is modulated as a PDCCH (S15) and transmitted to a terminal device.

Here, in an example of a usual case (normal DCI), during the above-described process of generating the Masked CRC (step S11 of FIG. 2), a 16-bit Initial CRC is generated that corresponds to the RNTI that is specified to include sixteen bits, as shown in FIG. 3A. Then, the XOR operation and the mod 2 operation between the Initial CRC and the RNTI are executed, and thereby a 16-bit Masked CRC is generated.

Whereas, in an example of the compact DCI, an Initial CRC having a short bit length that may not correspond to (match with) the 16-bit RNTI can be generated, as shown in FIG. 3B. Thus, in a case in which the bit length of the Initial CRC is reduced, a bit number of the RNTI may not match with a bit number of the Initial CRC. Consequently, there is a problem that a calculation process for generating the CRC (Masked CRC) may not be executed.

The above-described related art documents do not include any description that is related to generation of the Masked CRC during an encoding process of the compact DCI (shortened CRC). Thus, the above-described problem may not be resolved, and enhancement of coverage by using the compact DCI may not be achieved.

Hereinafter, an embodiment of the present invention (which is referred to as the embodiment below) is described by referring to the drawings. Note that the embodiment that is described below is merely an example, and embodiments of the present invention are not limited to the embodiment below.

In the embodiment of the present invention, a mobile network to which a terminal device can be connected may be a network that complies with the LTE. However, a network to which the present invention can be applied is not limited to this. Here, "LTE" in the embodiment of the present invention can be used in a sense that it includes not only communication systems that correspond to 3GPP Rel. 8 to Rel. 10, but also communication systems that correspond to 3GPP Rel. 11 and Rel. 12.

Further, in the embodiment of the present invention, the PDCCH is described to include both the PDCCH and the EPDCCH.

[System Configuration]

Figure 4:
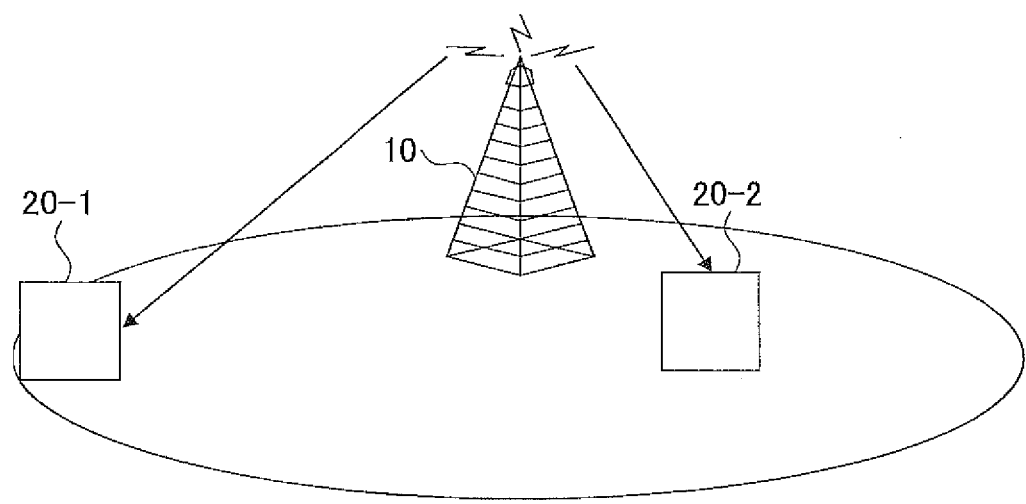
FIG. 4 is a schematic configuration diagram of a radio communication system according to an embodiment of the present invention.

FIG. 4 is a schematic configuration diagram of a radio communication system 1 according to the embodiment of the present invention.

The radio communication system 1 may include a base station (eNB) 10; a terminal device 20-1; and a terminal device 20-2. Each of the terminal devices 20-1 and 20-2 can be an MTC terminal (MTC-UE) 20. Information that is collected from the MTC terminal 20-1 and the MTC terminal 20-2 can be transmitted from the eNB 10 to a server (not shown) on a network, for example. Further, control information from a server can be transmitted from the base station 10 to the MTC terminals 20-1 and 20-2.

In FIG. 4, only the MTC terminals 20-1 and 20-2 are shown as the MTC terminals 20. Actually, a very large number of the MTC terminals 20 can be located. The eNB 10 may be connected to a transmission network, such as an optical fiber, or the eNB 10 may be connected to a communications-capable power line.

Note that a terminal device in the embodiment of the present invention is not limited to an MTC terminal. For example, the terminal device may be a mobile communication terminal (mobile station), such as a mobile telephone, a smartphone, a tablet, and so forth.

The base station 10 can execute a process of encoding normal DCI and compact DCI, which is obtained by reducing a bit length of the normal DCI, and the base station 10 can transmit the encoded DCI to the MTC terminals 20 through the PDCCH. Note that, in the embodiment of the present invention, when the normal DCI and the compact DCI are not distinguished, each of them may be simply referred to as the DCI. Further, a bit length of an Initial CRC that is generated based on the compact DCI by using a predetermined generating polynomial is reduced relative to a bit length (16 bits) of a normal Initial CRC. The reduced Initial CRC may be referred to as a shortened CRC.

The MTC terminal 20 receives the DCI that is transmitted from the base station 10 through the PDCCH, and the MTC terminal 20 executes a process of decoding the received DCI.

[DCI Encoding Process]

In the process of encoding the normal DCI (cf. FIG. 2) that is executed by the base station 10, the masking process (the XOR operation) is applied to the 16-bit RNTI (predetermined identification information) and the 16-bit Initial CRC (first information), and the Masked CRC is generated (step S11 in FIG. 2).

Figure 5:
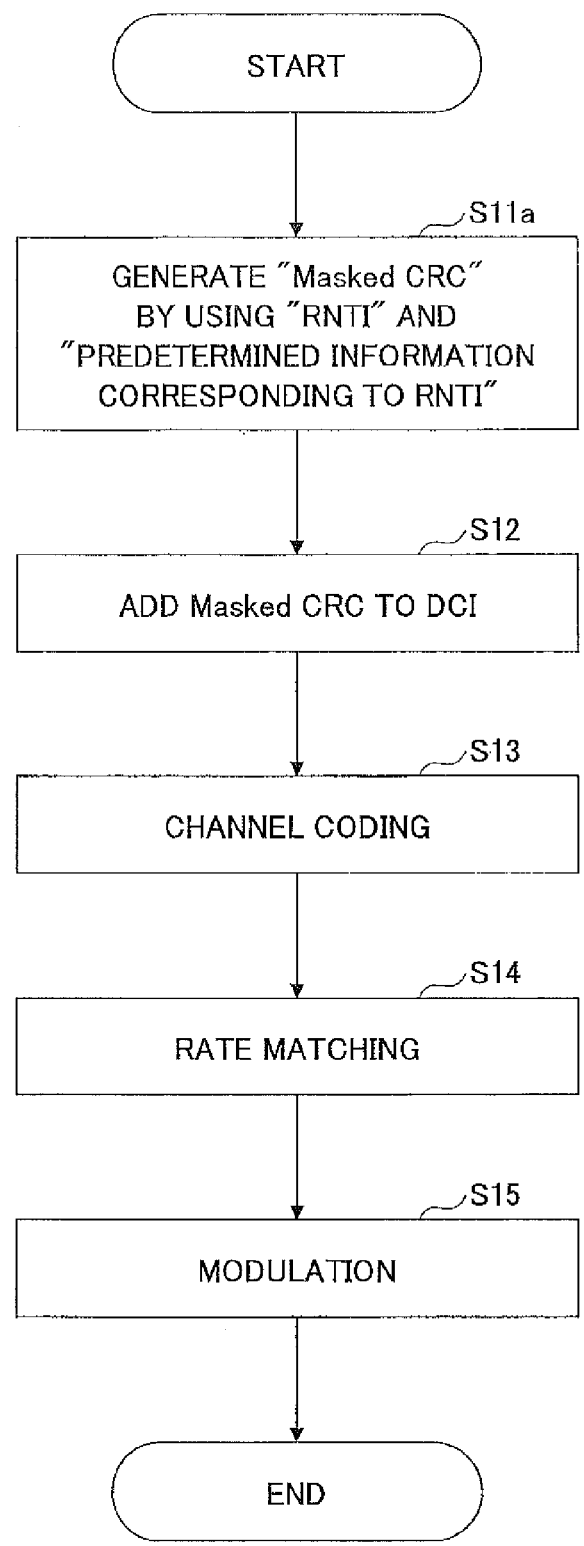
FIG. 5 is a flowchart showing the procedure of coding the compact DCI according to the embodiment of the present invention.

Whereas, in the process of encoding the compact DCI in the embodiment of the present invention, as shown in FIG. 5, a Masked CRC is generated by using a 16-bit RNTI (predetermined identification information) and predetermined information (second information) that corresponds to the RNTI (S11a). Note that the subsequent process (steps S12 to S15 of FIG. 5) is the same as the process from step S12 to S15 that is shown in FIG. 2.

Hereinafter, a method of generating a Masked CRC is explained by first to fourth examples for a case in which a bit length of the Initial CRC does not correspond to a bit length of the RNTI (for a case in which the bit length of the Initial CRC is less than the bit length of the RNTI) during the process of encoding the compact DCI. Further, in the following description, the Masked CRC may also be simply referred to as the CRC.

First Example

Figure 6:
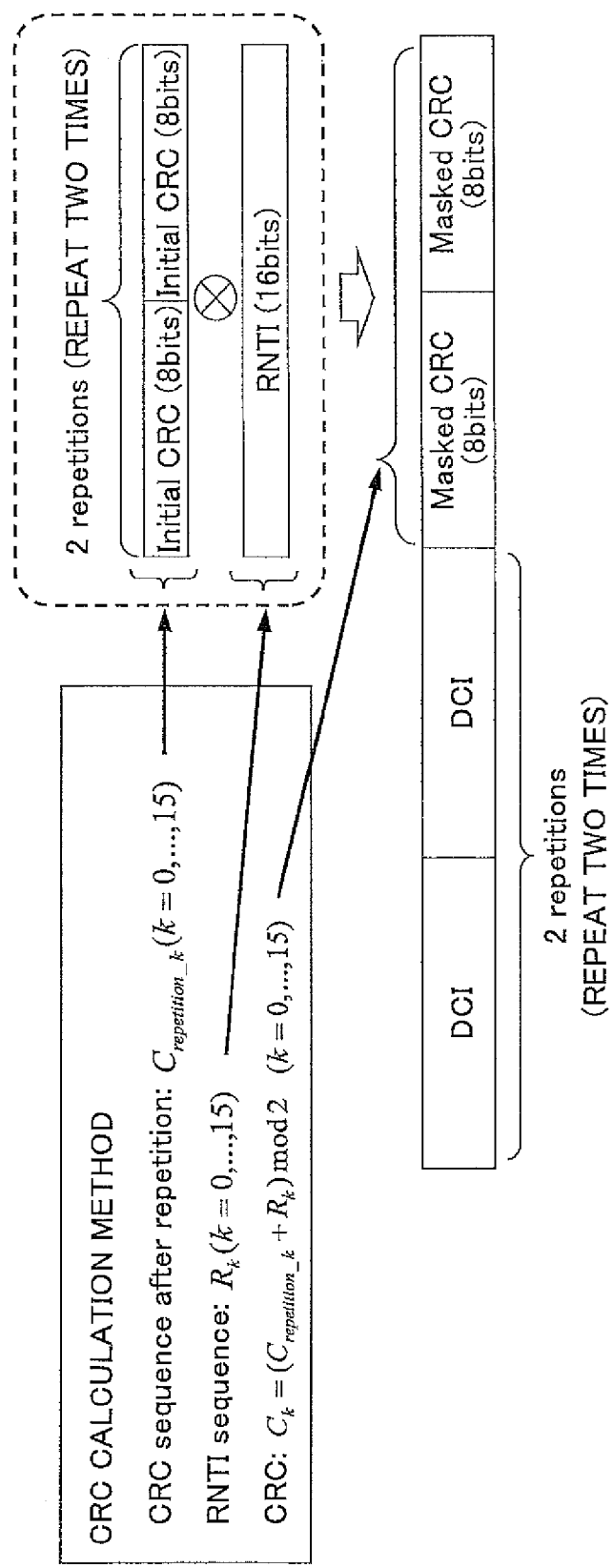
FIG. 6 is a diagram showing a method of generating the CRC in a first example.

FIG. 6 is a diagram showing a method of generating the CRC (Masked CRC) according to the first example. In the first example, if a bit length of an Initial CRC that is generated based on the compact DCI is less than the bit length of the RNTI, namely, for the case of the shortened CRC, the DCI and the Initial CRC are repeated until the bit length of the Initial CRCs becomes the bit length of the RNTI. Namely, in the first example, predetermined information corresponding to the RNTI is generated by the repeated Initial CRCs.

As shown in FIG. 6, for example, if the Initial CRC is eight bits, the Initial CRC is repeated two (=16/8) times so as to correspond to sixteen bits of the RNTI. Additionally, corresponding to the repetition of the Initial CRC, the DCI is also repeated two times. In this manner, by repeating the DCI, the coverage of the PDCCH can be enhanced. Then, a Masked CRC (8 bits×2) is generated by masking, by using the RNTI, predetermined information that is obtained by repeating the Initial CRC two times, and the Masked CRC is attached to the DCI. Subsequently, the process at and after the channel coding of step S13 of FIG. 5 is executed. Namely, the process of generating the predetermined information that corresponds to the RNTI is to be executed prior to execution of the channel coding.

Here, for example, if the Initial CRC is six bits, the Initial CRC is repeated two (≈16/6) times, and values of the top four bits of the Initial CRC are set to the remaining four bits (the remainder of the division) so as to correspond to sixteen bits of the RNTI. Here, the method is not limited to the above-described method. For example, the value "0" may be set to the remaining bit length (zero-padding) so as to correspond to the bit length of the RNTI.

Thus, if the Initial CRC is n bits and the RNTI is sixteen bits, in order to generate predetermined information that corresponds to the RNTI, the Initial CRC is repeated 16/n times, and if there is a remainder, values of the top 16 (mode n) bits may be set.

Note that the number of times of repeating the DCI and the number of times of repeating the Initial CRC may be independently determined. Additionally or alternatively, the number of times of repeating the DCI and the number of times of repeating the Initial CRC may be once (not repeated).

Second Example

Figure 7:
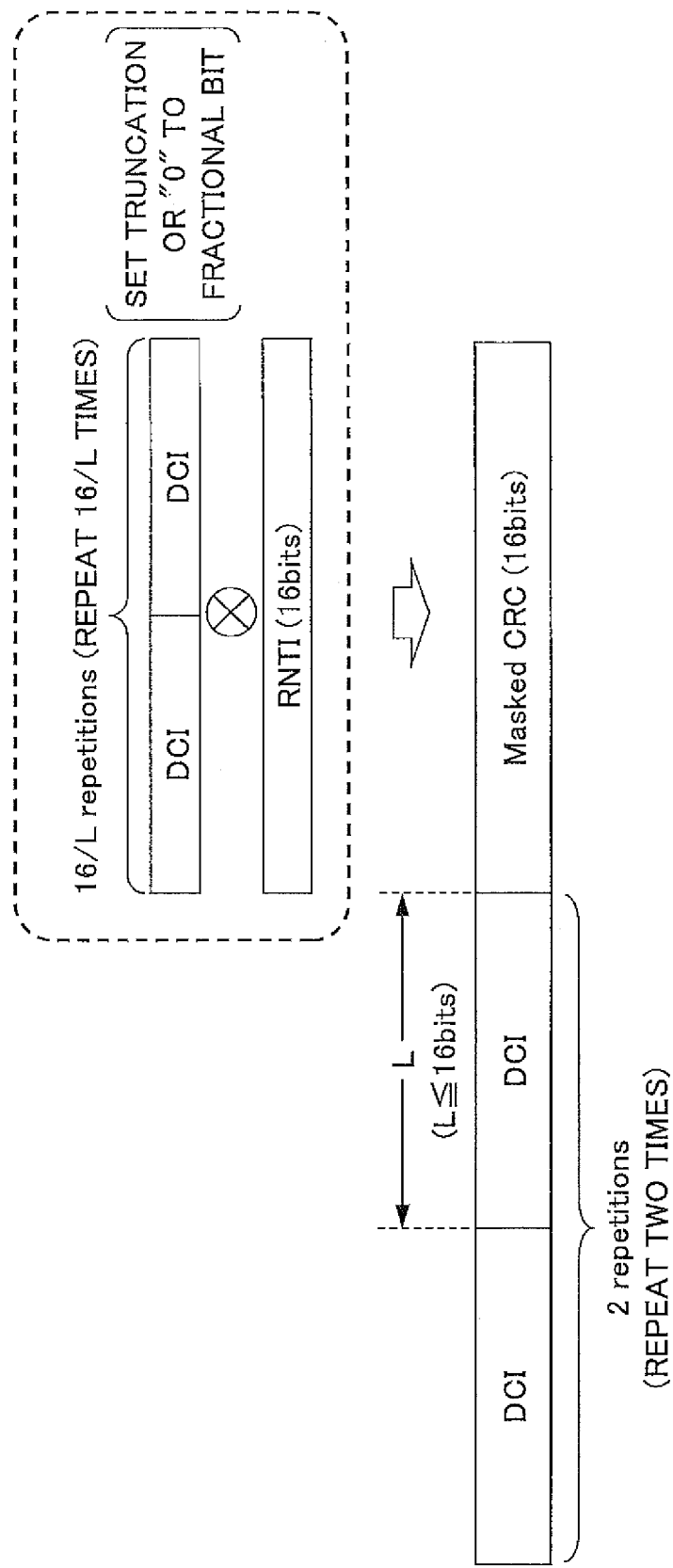
FIG. 7 is a diagram showing a method of generating the CRC in a second example.

FIG. 7 is a diagram showing a method of generating the CRC (Masked CRC) according to the second example. In the second example, if the bit length L of the DCI is less than or equal to sixteen bits of the RNTI, the Initial CRC is not generated, and repeated DCI(s) can be set in the field in which the Initial CRCs can be set. Namely, in the second example, if the bit length L of the DCI is less than or equal to sixteen bits of the RNTI, the predetermined information that is to correspond to the RNTI can be generated by the repeated DCI(s).

As shown in FIG. 7, if the DCI is L bits (L≤16 bits), information is generated by repeating the DCI 16/L times so as to correspond to sixteen bits of the RNTI, and the information is set to the field of the Initial CRCs. Then, the Masked CRC is generated by masking, by using the RNTI, the predetermined information that is obtained by repeating the DCI 16/L times, and the Masked CRC is attached to the DCI. Further, by repeating the DCI more than once (e.g., twice), as shown in FIG. 7, the coverage of the PDCCH can be enhanced. Subsequently, the process at and after the channel coding of step S13 of FIG. 5 is executed.

Note that if the length of the DCI that is repeated 16/L times is greater than sixteen bits, the bit length that is greater than sixteen bits is truncated. If the length is less than sixteen bits, padding is executed, for example, by using the value of "0," so that the length becomes sixteen bits.

Thus, in order to generate the predetermined information that is to correspond to the RNTI, if the DCI is L bits and the RNTI is sixteen bits, the DCI that is repeated 16/L times can be set to the field of the Initial CRCs. If, as a result of the above-described division, there is a remainder, the remainder can be truncated so as to correspond to sixteen bits, or the missing values can be padded by the values' of "0."

Note that the number of times of repeating the DCI and the number of times of repeating the DCI that can be set to the field of the Initial CRCs may be independently determined. Additionally or alternatively, the number of times of repeating the DCI and the number of times of repeating the DCI that can be set to the field of the Initial CRCs may be once (not repeated).

Third Example

Figure 8:
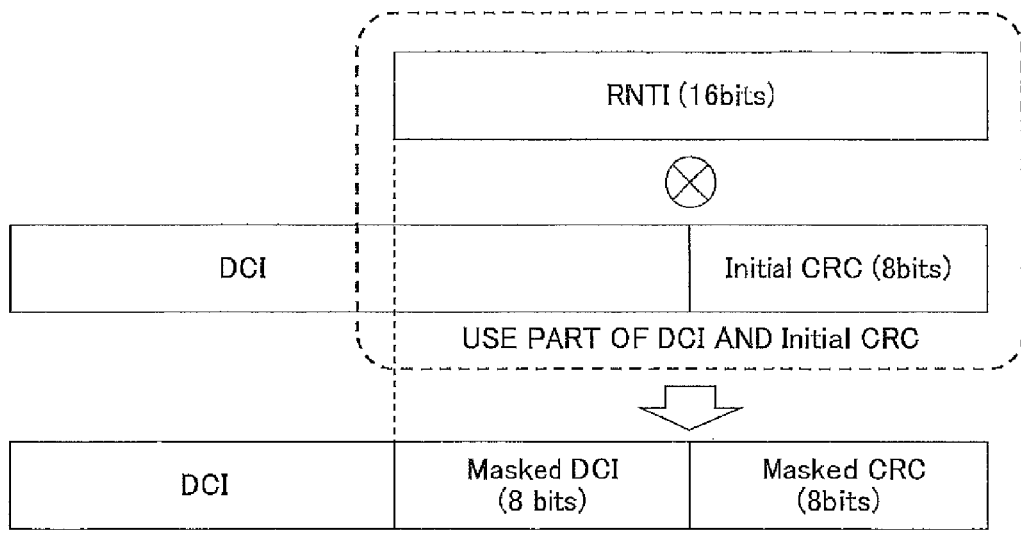
FIG. 8 is a diagram showing a method of generating the CRC in a third example.

FIG. 8 is a diagram showing a method of generating the CRC (Masked CRC) according to the third example. In the third example, the predetermined information that corresponds to the RNTI can be generated by the Initial CRC, which is generated based on the DCI, and a part of the DCI.

As shown in FIG. 8, for example, if the Initial CRC is eight bits, information (sixteen bits) that is obtained by combining the Initial CRC (eight bits) and a part of the DCI (eight bits) is used as a target of masking by the 16-bit RNTI. Then, Masked DCI (eight bits) and a Masked CRC (eight bits) are generated by masking, by using the RNTI, the information that is obtained by combining the Initial CRC and the part of the DCI, and the Masked DCI and the Masked CRC are attached to the DCI. Namely, in the third example, the part of the DCI is masked (is replaced with the Masked DCI). Subsequently, the process at and after the channel coding of step S13 of FIG. 5 is executed.

Fourth Example

Figure 9:
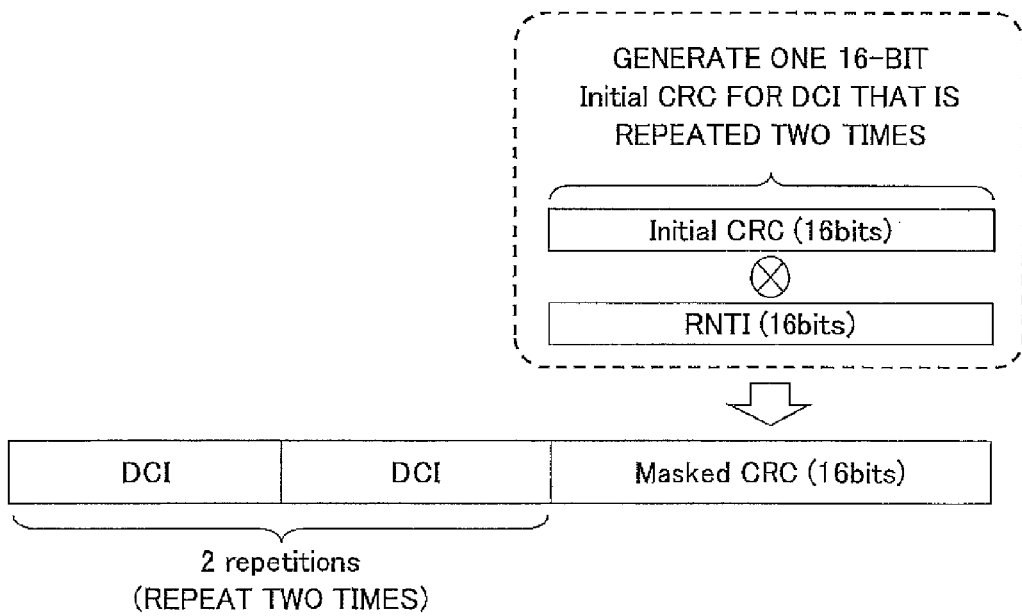
FIG. 9 is a diagram showing a method of generating the CRC in a fourth example.

FIG. 9 is a diagram showing a method of generating the CRC (Masked CRC) according to the fourth example. In the fourth example, the predetermined information corresponding to the RNTI can be generated as a 16-bit Initial CRC that is generated based on the (repeated) DCI(s) by using a predetermined generating polynomial.

As shown in FIG. 9, as a target of masking by the 16-bit RNTI, a 16-bit Initial CRC is generated by using the generating polynomial based on the DCI that is repeated twice, for example. Then, a Masked CRC (sixteen bits) is generated by masking, by using the RNTI, the 16-bit Initial CRC, and the Masked CRC is attached to the DCI. Subsequently, the process at and after the channel coding of step S13 of FIG. 5 is executed.

By the above-described example 1 to example 4, even for a case of the shortened CRC, the CRC (Masked CRC) that is to be attached to the DCI can be generated. Further, the methods of generating the CRC in the first example to the fourth example can be applied to the PDCCH/EPDCCH, to the PDCCH/EPDCCH in a common search space, and to the PDCCH/EPDCCH in a UE specific search space.

Note that, among the first example to the fourth example, the methods of generating the CRC according to the first example and the second example in which the DCI is repeated are preferable from the perspective of enhancing the coverage of the PDCCH/EPDCCH.

The base station 10 and the MTC terminal 20 in the radio communication system 1 according to the embodiment of the present invention can process the normal DCI (normal CRC) and the compact DCI (shortened CRC). Accordingly, as a method of switching, by the base station 10, between the normal CRC and the shortened CRC, a semi-static switching method and a dynamic switching method can be considered.

Hereinafter, depending on the switching method between the normal CRC and the shortened CRC, the operation in which switching is semi-statically executed is explained as the fifth example, and two patterns of the operation in which switching is dynamically executed are explained as a sixth example and a seventh example.

Fifth Example

In the fifth example in which switching is semi-statically executed between the normal CRC and the shortened CRC, the base station 10 reports, to the MTC 20, which type of the CRC (CRC configured type) is to be used, by using a higher layer signaling (e.g., the RRC signaling). The base station 10 executes a process of encoding the DCI corresponding to the CRC configured type ("normal" or "shortened"), and the base station 10 transmits the DCI to the MTC terminal 20 through the PDCCH. The MTC terminal 20 executes a CRC check (error detection) by using the CRC that is based on the CRC configured type reported by the RRC signaling, and the MTC terminal 20 executes operation to receive own terminal addressed DCI, based on the result of the CRC check.

Figure 10:
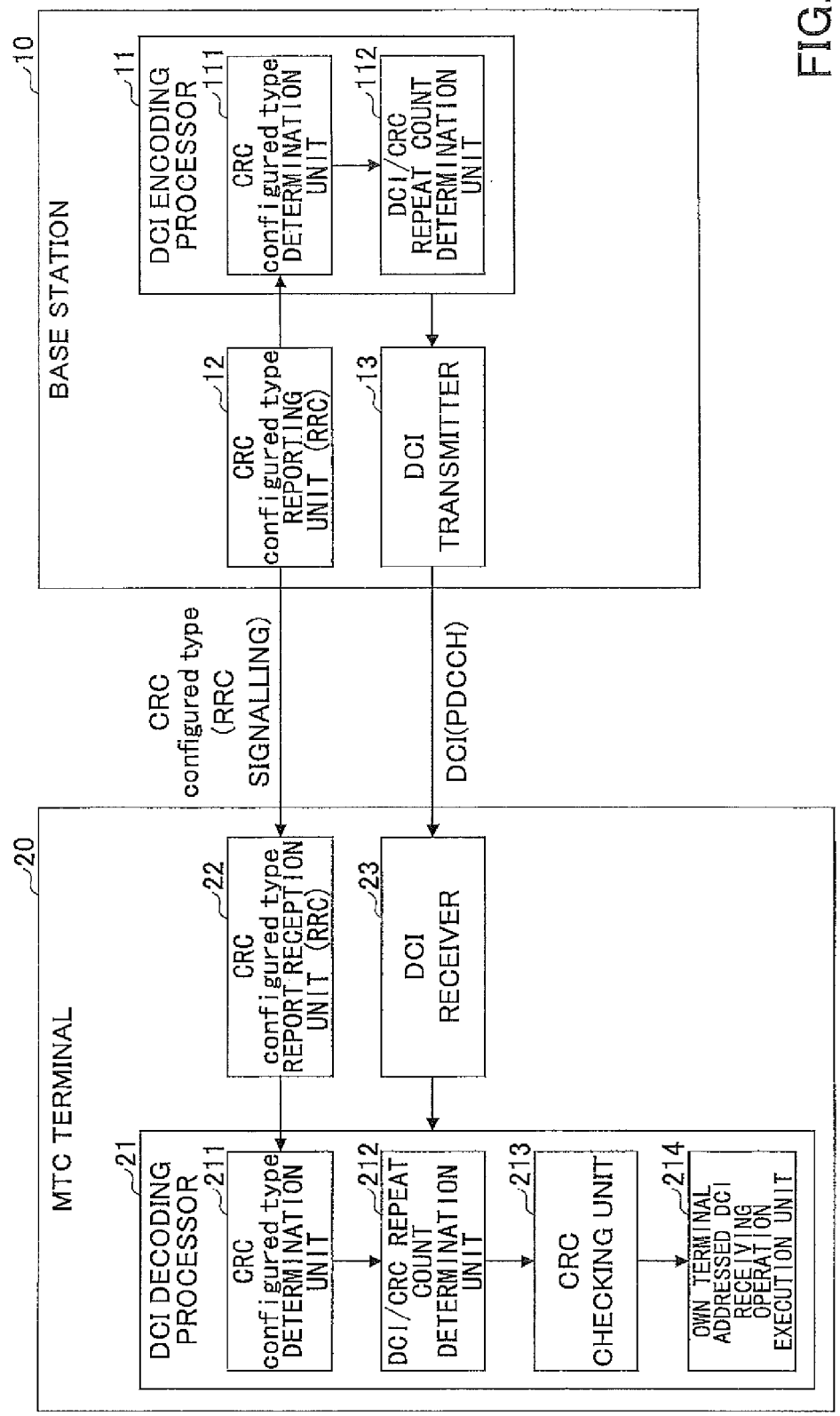
FIG. 10 is a functional block diagram showing an example of a functional configuration of the radio communication system in a fifth example.

FIG. 10 is a functional block diagram showing an example of a functional configuration of the radio communication system 1 according to the fifth example.

<Base Station>

The base station 10 may include a DCI encoding processor 11; a CRC configured type reporting unit (RRC) 12; and a DCI transmitter 13. The DCI encoding processor 11 may include a CRC configured type determination unit 111; and a DCI/CRC repeat count determination unit 112.

The DCI encoding processor 11 can execute a process of attaching the CRC (Masked CRC) to the DCI, a process of channel coding, a process of rate matching, a process of modulating the PDCCH, and so forth.

The CRC configured type determination unit 111 can determine a method of generating the CRC, based on the CRC configured type that is reported, to the MTC terminal 20, by the CRC configured type reporting unit (RRC) 12.

The DCI/CRC repeat count determination unit 112 can determine, upon detecting that the CRC configured type is "shortened," a number of times of repeating the DCI or the CRC for generating the predetermined information corresponding to the RNTI in the above-described first to fourth examples, and the DCI/CRC repeat count determination unit 112 can generate the predetermined information. Upon determining that the CRC configured type is "normal," the process by the DCI/CRC repeat count determination unit 112 may not be executed.

Note that, for a case that the CRC configured type is "normal," the DCI encoding processor 11 can generate the Initial CRC from the DCI by using a predetermined generating polynomial.

The CRC configured type reporting unit (RRC) 12 can report, to the MTC terminal 20, the CRC configured type ("normal" or "shortened") by using the RRC signaling, which can be higher layer signaling. Additionally, the CRC configured type reporting unit (RRC) 12 can report, to the CRC configured type determination unit 111, the CRC configured type that is reported by using the RRC signaling.

The DCI transmitter 13 can transmit the DCI to the MTC terminal 20 through the PDCCH.

<MTC Terminal>

The MTC terminal 20 may include a DCI decoding processor 21; a CRC configured type report reception unit (RRC) 22; and a DCI receiver 23. The DCI decoding processor 21 may include a CRC configured type determination unit 211; a DCI/CRC repeat count determination unit 212; a CRC checking unit 213; and an own terminal addressed DCI receiving operation execution unit 214.

The DCI decoding processor 21 can execute a process of decoding received DCI (PDCCH). Specifically, the DCI decoding processor 21 can attempt to execute, with respect to each of PDCCH candidates, blind decoding that includes a CRC checking process so as to detect an own terminal addressed PDCCH out of the PDCCH candidates for each subframe.

The CRC configured type determination unit 211 can determine as to which type of the CRC checking is to be executed, based on the CRC configured type that is reported from the base station 10 by using the RRC signaling.

The DCI/CRC repeat count determination unit 212 can determine a number of times of repeating the DCI or the Initial CRC that can be included in the predetermined information corresponding to the RNTI.

The CRC checking unit 213 can execute a CRC checking process by using the CRC that is attached to the received DCI. Specifically, for example, the CRC checking unit 213 can determine, upon detecting that the CRC checking of the PDCCH (DCI) that is demasked by using an own terminal RNTI is OK (the CRC matches), that the PDCCH includes own terminal addressed DCI. Then, the CRC checking unit 213 can request the own terminal addressed DCI receiving operation execution unit 214 to execute operation for receiving the own terminal addressed DCI. Whereas, upon detecting that the CRC checking is NG (the CRC does not match), the CRC checking unit 213 may not execute the operation for receiving the own terminal addressed DCI. Note that the case in which the CRC checking is NG can be a case in which the own terminal addressed PDCCH is erroneously decoded, a case in which the PDCCH that is addressed to another MTC terminal 20 is attempted to decode, and so forth.

The own terminal addressed DCI receiving operation execution unit 214 can execute operation for receiving the DCI for which the CRC checking is OK, namely, operation for receiving the own terminal addressed DCI.

The CRC configured type report reception unit (RRC) 22 can receive the CRC configured type ("normal" or "shortened") that is reported by using the RRC signaling, which can be higher layer signaling.

The DCI receiver 23 can receive the DCI that is transmitted from the base station through the PDCCH.

Sixth Example

In the sixth example, the base station 10 reports, to the MTC terminal 20 through a physical layer (e.g., the PDCCH), the type of the CRC (CRC configured type) that can be dynamically switched, namely, that can be switched for every predetermined time period (subframe). Then, the base station 10 executes a process of encoding the DCI depending on the dynamically switched CRC configured type ("normal" or "shortened"), and the base station 10 transmits the DCI to the MTC terminal 20 through the PDCCH. The MTC terminal 20 executes CRC checking based on the CRC configured type that is reported through the PDCCH, and the MTC terminal 20 executes operation for receiving own terminal addressed DCI, based on the result of the CRC checking.

Figure 11:
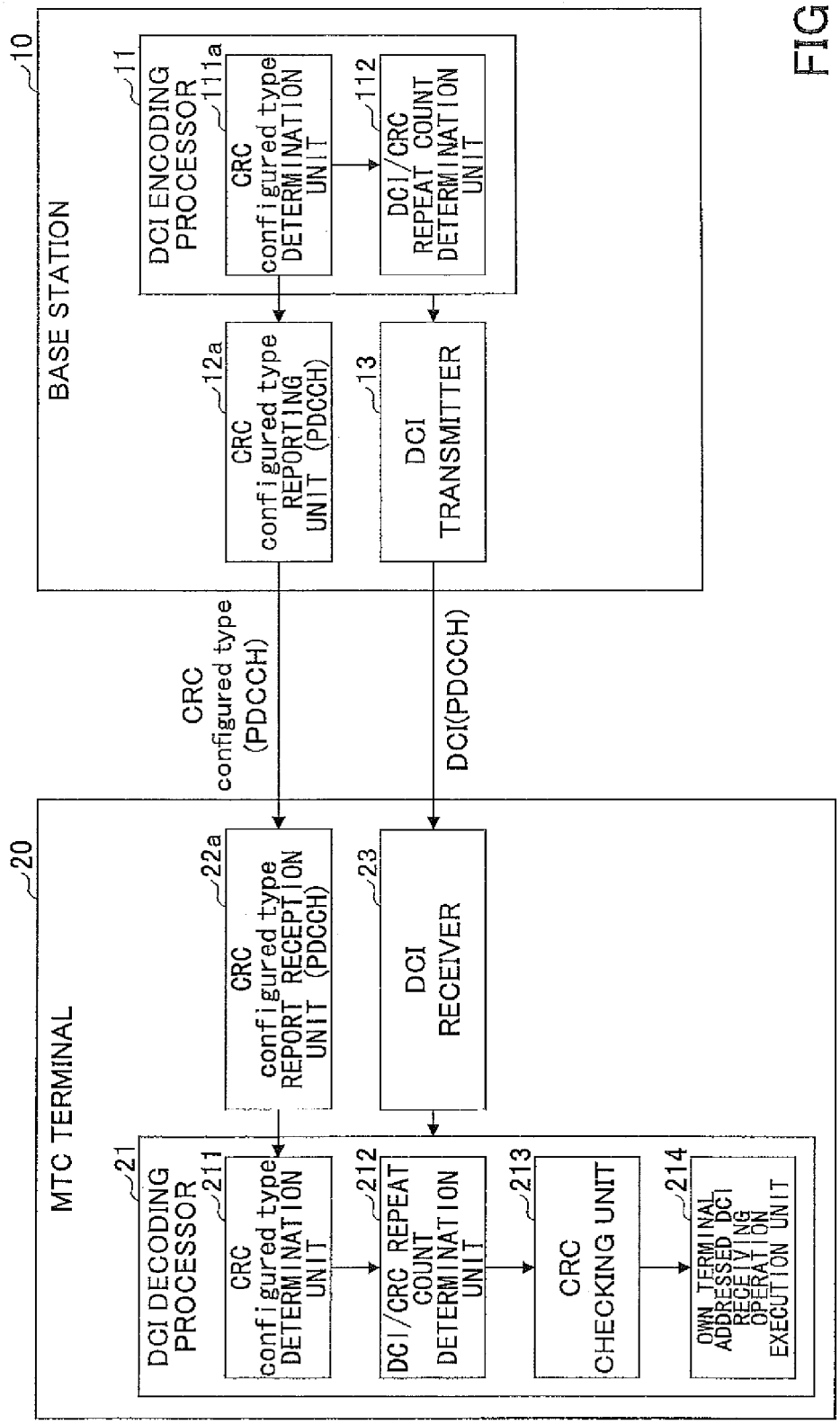
FIG. 11 is a functional block diagram showing an example of a functional configuration of the radio communication system in a sixth example.

FIG. 11 is a functional block diagram showing an example of a functional configuration of the radio communication system 1 in the sixth example.

<Base Station>

The base station 10 may include the DCI encoding processor 11; a CRC configured type reporting unit (PDCCH) 12a; and the DCI transmitter 13. The DCI encoding processor 11 may include a CRC configured type determination unit 111a; and the DCI/CRC repeat count determination unit 112. Among the above-described functions, the DCI encoding processor 11, the DCI/CRC repeat count determination unit 112, and the DCI transmitter 13 are the same as the functions that can be included in the base station 10 of the fifth example, which is shown in FIG. 10. Thus, descriptions of these are omitted.

The CRC configured type determination unit 111a can dynamically (every predetermined time period) switch the type of the CRC to be generated. The CRC configured type determination unit 111a can request, upon detecting that the CRC configured type is "shortened," the DCI/CRC repeat count determination unit 112 to execute a process of determining a number of times of repeating the DCI or the CRC for generating the predetermined information corresponding to the RNTI in the above-described first to fourth examples. Whereas, upon determining that the CRC configured type is "normal," the process by the DCI/CRC repeat count determination unit 112 may not be executed, and the DCI encoding processor 11 executes a process of encoding the normal DCI, which includes a process of generating the normal CRC. Additionally, the CRC configured type determination unit 111a reports, to the CRC configured type reporting unit (PDCCH) 12a, the type of the CRC that can be dynamically switched.

The CRC configured type reporting unit (PDCCH) 12a reports, to the MTC terminal 20, the CRC configured type ("normal" or "shortened") through the PDCCH, which is within the physical layer.

<MTC Terminal>

The MTC terminal 20 may include the DCI decoding processor 21; a CRC configured type report reception unit (PDCCH) 22a; and the DCI receiver 23. The DCI decoding processor 21 may include the CRC configured type determination unit 211; the DCI/CRC repeat count determination unit 212; the CRC checking unit 213; and the own terminal addressed DCI receiving operation execution unit 214. Note that, among the above-described functions, the functions other than the CRC configured type report reception unit (PDCCH) 22a are the same as the functions that can be included in the MTC terminal 20 of the fifth example, which is shown in FIG. 10. Thus, descriptions of these are omitted.

The CRC configured type report reception unit (PDCCH) 22a receives the CRC configured type ("normal" or "shortened") that is reported through the PDCCH, which is within the physical layer.

Figure 12:
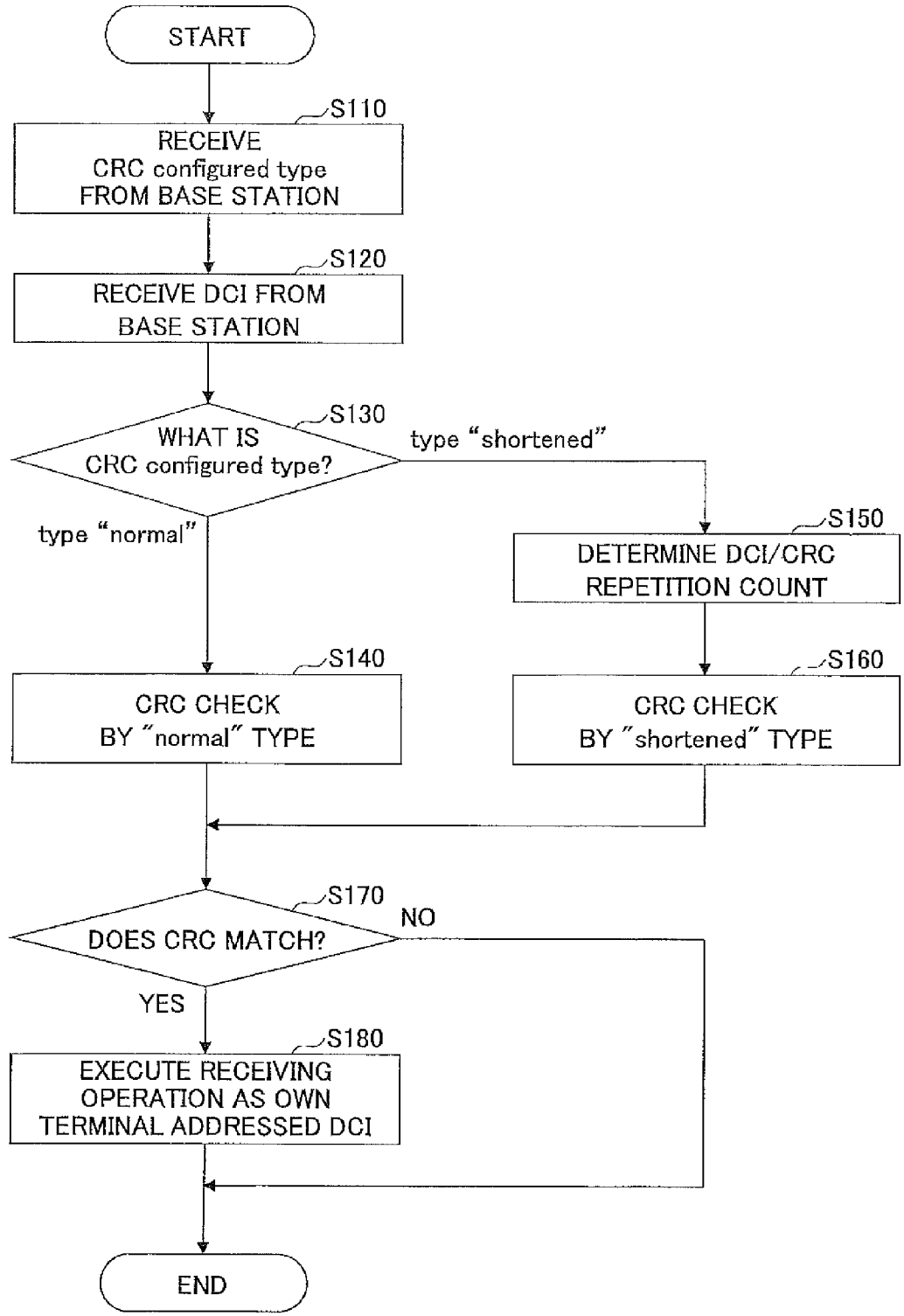
FIG. 12 is a flowchart showing an example of a procedure of an MTC terminal in the fifth and sixth example.

Here, a procedure by the MTC terminal 20 in the fifth example and in the sixth example is described by using the flowchart that is shown in FIG. 12.

As shown in FIG. 12, at step S110, the MTC terminal 20 receives the CRC configured type that is transmitted from the base station 10 through the RRC signaling or the PDCCH. The CRC configured type report reception unit (RRC) 22 or the CRC configured type report reception unit (PDCCH) 22a that receives the CRC configured type reports the received CRC configured type to the CRC configured type determination unit 211.

At step S120, the DCI receiver 23 receives the DCI that is transmitted from the base station 10 through the PDCCH. The DCI receiver 23 reports the received DCI to the DCI decoding processor 21.

At step S130, the CRC configured type determination unit 211 determines the type of the CRC based on the received CRC configured type. Here, if the CRC configured type is "normal," the process at step S140 is to be executed. If the CRC configured type is "shortened," the process at step S150 is to be executed.

If the CRC configured type is "normal," at step S140, the CRC checking unit 213 executes CRC checking by using the CRC configuration type "normal."

If the CRC configured type is "shortened," at step S150, the DCI/CRC repeat count determination unit 212 determines a number of times of repeating the DCI or the CRC (Initial CRC) that can be included in the predetermined information corresponding to the RNTI.

At step S160, the CRC checking unit 213 executes the CRC checking by using the CRC configured type "shortened" because the CRC configured type is "shortened."

At step S170, the result of the CRC checking (whether the CRC matches) at above-described step S140 or step S160 is determined.

Upon determining, as a result of the CRC checking, that the CRC matches (the CRC checking is OK) (YES at step S170), the own terminal addressed DCI receiving operation execution unit 214 executes, at step S180, operation for receiving the own terminal addressed DCI.

Whereas, upon determining, as a result of the CRC checking, that the CRC does not match (the CRC checking is NG) (NO at step S170), the operation for receiving the own terminal addressed DCI may not be executed, and the process for the DCI is terminated.

By the above-described procedure, the MTC terminal 20 can execute the CRC checking that depends on the type of the CRC, regardless of the type of the CRC, and the MTC terminal 20 can execute operation for receiving the own terminal addressed DCI based on the result of the CRC checking.

Seventh Example

In the seventh example, similar to the sixth example, the base station 10 dynamically switches the CRC configured type ("normal" or "shortened"), and the base station 10 generates the CRC corresponding to the type of the CRC. However, in the seventh example, the process of reporting the CRC configured type through the PDCCH, which is executed by the base station 10 in the sixth example, is not executed. Thus, the MTC terminal 20 in the seventh example executes CRC checking for all types of CRCs, and upon detecting that CRC checking for some type of the CRC is OK, the MTC terminal 20 executes operation for receiving the own terminal addressed DCI.

Figure 13:
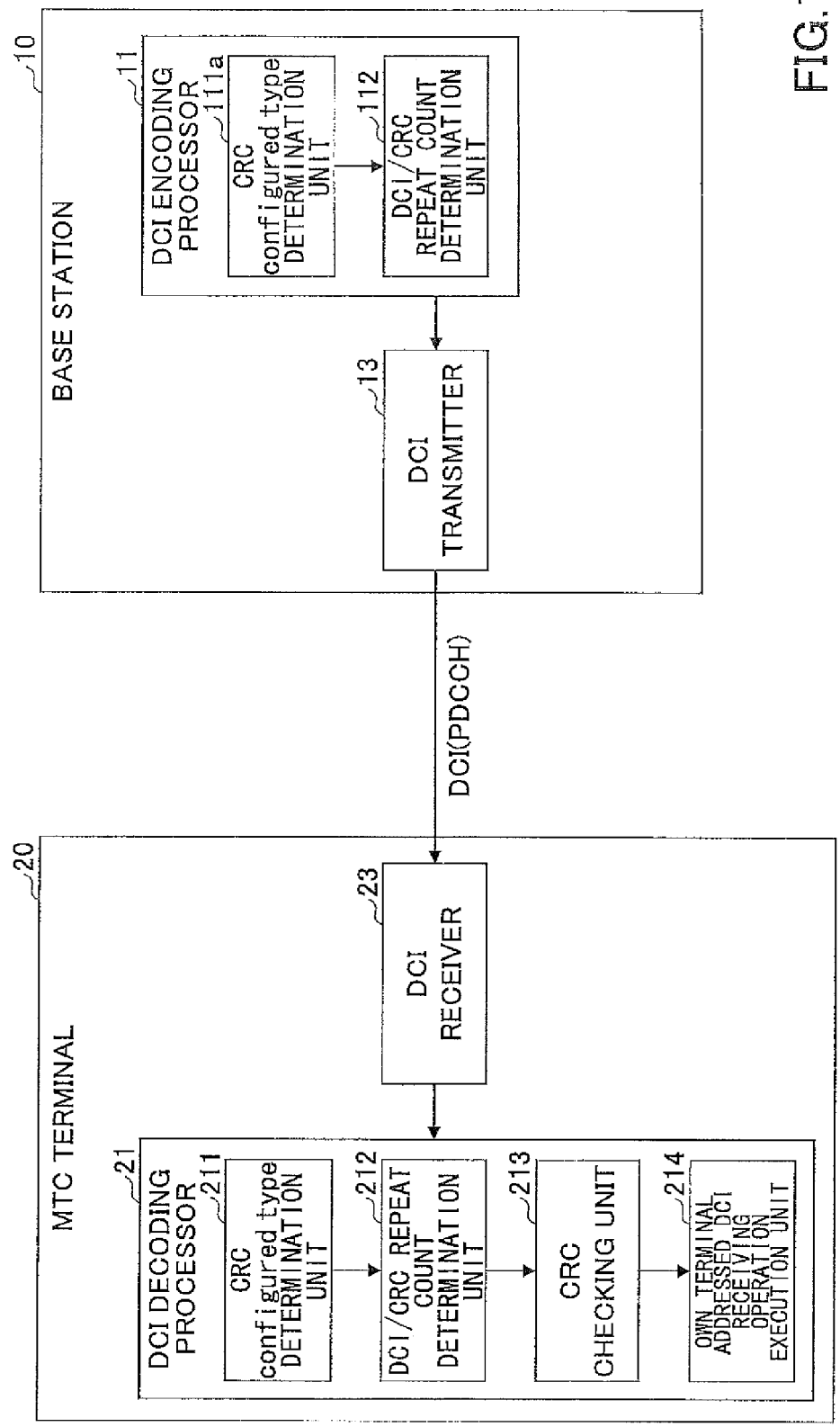
FIG. 13 is a functional block diagram showing an example of a functional configuration of the radio communication system in a seventh example.

FIG. 13 is a functional block diagram showing an example of a functional configuration of the radio communication system 1 in the seventh example. As shown in FIG. 13, the functional configuration of the seventh example is the same as the functional configuration of the sixth example, except for the point that the base station 10 of the seventh example may not include the CRC configured type reporting unit (PDCCH) 12a that can be included in the base station 10 of the sixth example, and that the MTC terminal 20 of the seventh example may not include the CRC configured type report reception unit (PDCCH) 22a that can be included in the MTC terminal 20 of the sixth example. Thus, descriptions of the functions are omitted.

Figure 14:
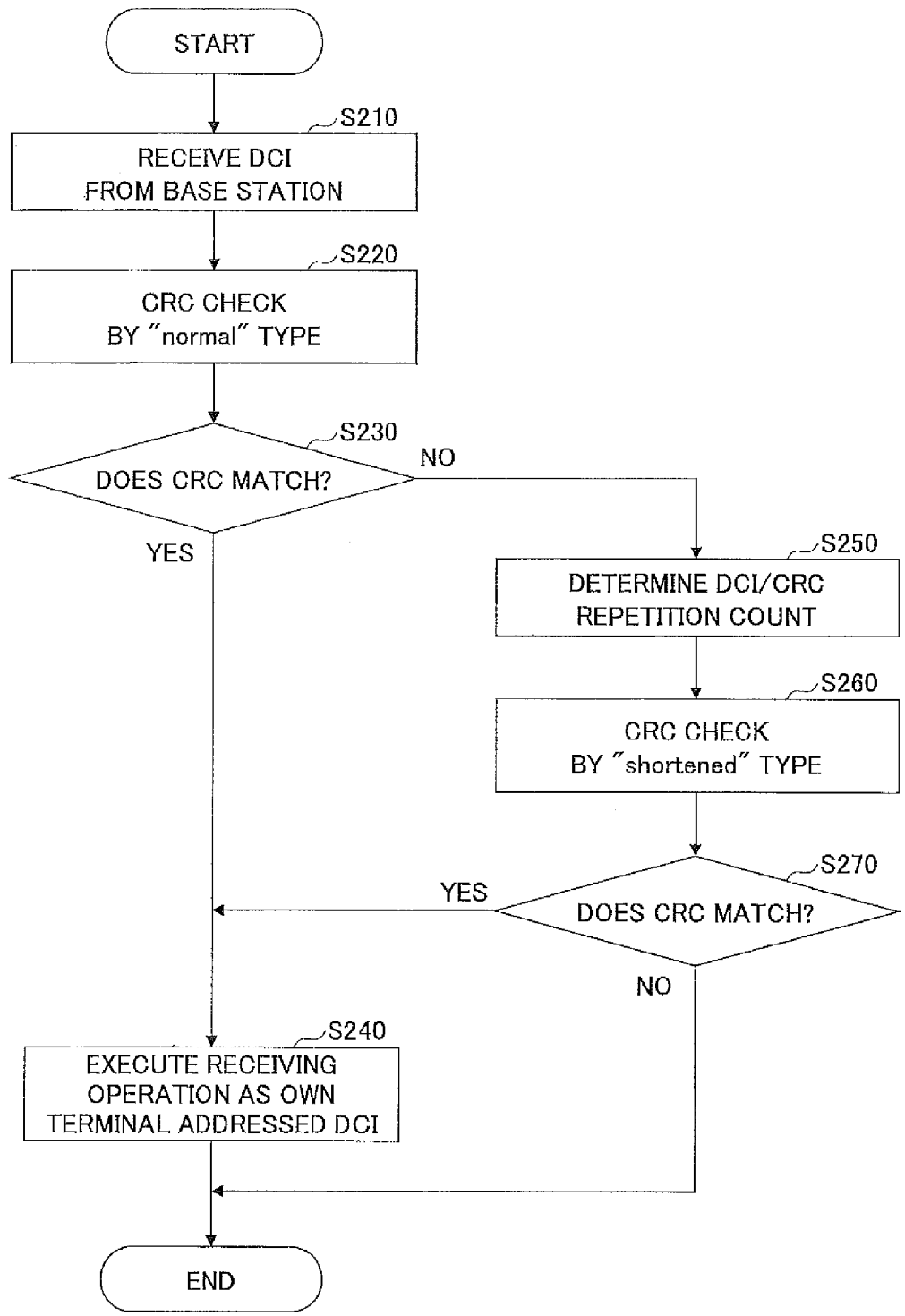
FIG. 14 is a flowchart showing an example of a procedure of the MTC terminal in the seventh example.

Note that the MTC terminal 20 in the seventh example executes the procedure, such as shown in FIG. 14, because the type of the CRC may not be reported, in advance, from the base station 10.

As shown in FIG. 14, at step S210, the DCI receiver 23 of the MTC terminal 20 receives the DCI that is transmitted from the base station 10 through the PDCCH. The DCI receiver 23 reports the received DCI to the DCI decoding processor 21.

At step S220, the CRC configured type determination unit 211 causes the CRC checking unit 213 to execute CRC checking by using the CRC configured type "normal."

At step S230, the result of the CRC checking at above-described step S220 is determined.

Upon determining, as the result of the CRC checking, that the CRC matches (the CRC checking is OK) (YES at step S230), the own terminal addressed DCI receiving operation execution unit 214 executes, at step S240, operation for receiving the own terminal addressed DCI.

Whereas, upon determining, as the result of the CRC checking, that the CRC does not match (the CRC checking is NG) (NO at step S230), the process corresponding to the CRC configured type "shortened" is executed at step S250. The DCI/CRC repeat count determination unit 212 determines a number of times of repeating the DCI or the CRC (Initial CRC) that can be included in the predetermined information corresponding to the RNTI.

At step S260, the CRC checking unit 213 executes CRC checking by using the CRC configured type "shortened."

At step S270, the result of the CRC checking at above-described step S260 is determined.

Upon determining, as the result of the CRC checking, that the CRC matches (the CRC checking is OK) (YES at step S270), the own terminal addressed DCI receiving operation execution unit 214 executes, at step S240, operation for receiving the own terminal addressed DCI.

Whereas, upon determining, as the result of the CRC checking, that the CRC does not match (the CRC checking is NG) (NO at step S270), the operation for receiving the own terminal addressed DCI is not executed, and the process for the DCI is terminated.

By the above-described procedure, the MTC terminal 20 can execute CRC checking for each of the types of the CRCs, regardless of the type of the CRC, and the MTC terminal 20 can execute operation for receiving the own terminal addressed DCI, based on the result of the CRC checking.

As described above, in the radio communication system 1 according to the embodiment of the present invention, even if the Initial CRC does not correspond to (the bit length does not match with) the predetermined identification information (RNTI), the base station 10 can generate the predetermined information corresponding to the RNTI, and the base station 10 can generate the CRC that is masked by the RNTI. Then, upon receiving the DCI that is transmitted from the base station 10 and to which the CRC is attached, the MTC terminal 20 can execute CRC checking regardless of the type of the CRC, and the MTC terminal 20 can execute operation for receiving the own terminal addressed DCI based on the result of the CRC checking. Additionally, the base station 10 can execute the process of generating the CRC semi-statically or dynamically.

In this manner, the CRC that is masked by the RNTI can be attached to the compact DCI. Then, by repeating the DCI (control information) by using the compact DCI, the coverage of the physical downlink control channel (PDCCH/EPDCCH) can be enhanced.

Note that, in the above-described examples, the descriptions are made based on the MTC terminal, as an example of the terminal device. However, the terminal device is not limited to the MTC terminal, and the present invention can be applied to any mobile station.

Note that, in the above-described example, the descriptions are made by using the CRC, as an example of an error detection code. However, the error detection code is not limited to the CRC, and the present invention can be applied to any error detection code.

Note that, in the above-described example, the bit length of the RNTI, which is an example of the predetermined identification information, is defined to be 16 bits based on the specification. However, the bit length of the RNTI is not limited to 16 bits, and the present invention can be applied to any bit length.

The base station, the terminal device, and the radio communication system that can generate an error detection code that is masked by predetermined identification information and that can enhance coverage of a physical downlink control channel are described above by the embodiment. However, the present invention is not limited to the above-described embodiment, and various modifications and improvements can be made within the scope of the present invention. For convenience of the explanation, specific examples of numerical values are used in order to facilitate understanding of the invention. However, these numerical values are simply illustrative, and any other appropriate values may be used, except as indicated otherwise. For the convenience of explanation, the devices according to the embodiments of the present invention are explained by using functional block diagrams. However, these devices may be implemented in hardware, software, or combinations thereof. The separations of the items in the above explanation are not essential to the present invention. Depending on necessity, subject matter described in two or more items may be combined and used, and subject matter described in an item may be applied to subject matter described in another item (provided that they do not contradict).

The present international application is based on and claims the benefit of priority of Japanese Patent Application No. 2013-151897, filed on Jul. 22, 2013, the entire contents of Japanese Patent Application No. 2013-151897 are hereby incorporated by reference.

LIST OF REFERENCE SYMBOLS

1: Radio communication system
10: Base station
11: DCI encoding processor
111, 111a: CRC configured type determination unit
112: DCI/CRC repeat count determination unit
12: CRC configured type reporting unit (RRC)
12a: CRC configured type reporting unit (PDCCH)
13: DCI transmitter
20: MTC terminal (terminal device)
21: DCI decoding processor
211: CRC configured type determination unit
212: DCI/CRC repeat count determination unit
213: CRC checking unit
214: Own terminal addressed DCI receiving operation execution unit
22: CRC configured type report reception unit (RRC)
22a: CRC configured type report reception unit (PDCCH)
23: DCI receiver

The invention claimed is:
1. A base station configured to transmit control information to a terminal device in a radio communication system, wherein an error detection code that is masked by predetermined identification information is attached to the control information, the base station comprising:
a generator configured to generate, upon detecting that a length of first information that is to be masked by the predetermined identification information to generate the error detection code does not correspond to a length of the predetermined identification information, second information that corresponds to the length of the predetermined identification information; and
an error detection code generator configured to generate, upon detecting that the second information is generated, the error detection code by masking the generated second information with the predetermined identification information.

2. The base station according to claim 1,
wherein the generator is configured to generate the second information that is obtained by repeating the first information until a length of the repeated first information becomes the length of the predetermined identification information.

3. The base station according to claim 1,
wherein the generator is configured to generate the second information that is obtained by repeating the control information until a length of the repeated control information becomes the length of the predetermined identification information.

4. The base station according to claim 1, further comprising:
a reporting unit configured to report, prior to transmitting the control information, a type that indicates whether the length of the first information is less than the length of the predetermined identification information to the terminal device by higher layer signaling,
wherein the error detection code generator is configured to generate the error detection code in which the first information is masked by the predetermined identification information or the error detection code in which the second information is masked by the predetermined identification information, depending on the type that is reported by the reporting unit.

5. The base station according to claim 1,
wherein the error detection code generator is configured to generate the error detection code by switching, every predetermined time period, between the error detection code in which the first information is masked by the predetermined identification information and the error detection code in which the second information is masked by the predetermined identification information.

6. The base station according to claim 5, further comprising:
a reporting unit configured to report, every predetermined time period, a type that indicates whether the length of the first information is less than the length of the predetermined identification information to the terminal device through a physical downlink control channel.

7. The base station according to claim 1, further comprising:
a transmitter configured to transmit, to the terminal device, concatenated control information generated by repeating the control information,
wherein the error detection code generated by masking the second information with the predetermined identification information is attached to the concatenated control information.

8. A terminal device configured to communicate with a base station in a radio communication system, the terminal device comprising:

a receiver configured to receive, from the base station, control information to which an error detection code is attached; and an error detector configured to execute error detection based on a type by using the error detection code that is attached to the received control information, wherein the type indicates whether a length of first information is less than a length of predetermined identification information, and the first information is to be masked with the predetermined identification information so as to generate, by the base station, the masked error detection code.

9. The terminal device according to claim 8, wherein the error detector is configured to execute, upon detecting that the type is not reported prior to receiving the control information, error detection for each type.

10. A radio communication system comprising:

a terminal device; and a base station configured to transmit, to the terminal device, control information to which an error detection code that is masked by predetermined identification information is attached, wherein the base station includes a generator configured to generate, upon detecting that a length of first information that is to be masked by the predetermined identification information to generate the error detection code does not correspond to a length of the predetermined identification information, second information that corresponds to the length of the predetermined identification information; and an error detection code generator configured to generate, upon detecting that the second information is generated, the error detection code by masking the generated second information with the predetermined identification information, and the terminal device includes an error detector configured to execute error detection based on a type that indicates whether the length of the first information is less than the length of the predetermined identification information.

* * * * *